(12) United States Patent
Cheng et al.

(10) Patent No.: US 7,211,474 B2
(45) Date of Patent: May 1, 2007

(54) SOI DEVICE WITH BODY CONTACT SELF-ALIGNED TO GATE

(75) Inventors: Kangguo Cheng, Beacon, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 286 days.

(21) Appl. No.: 10/905,708

(22) Filed: Jan. 18, 2005

(65) Prior Publication Data
US 2006/0160294 A1    Jul. 20, 2006

(51) Int. Cl.
*H01L 21/84* (2006.01)
(52) U.S. Cl. .............. 438/153; 438/221; 257/E21.546
(58) Field of Classification Search ........... 438/153, 438/221, 589; 257/E21.546
See application file for complete search history.

(56) References Cited

U.S. PATENT DOCUMENTS

| | | | |
|---|---|---|---|
| 4,604,162 A | 8/1986 | Sobczak | |
| 5,240,883 A | 8/1993 | Abe et al. | |
| 5,488,004 A | 1/1996 | Yang | |
| 5,661,044 A | 8/1997 | Holland et al. | |
| 5,691,230 A | 11/1997 | Forbes | |
| 5,918,136 A | 6/1999 | Nakashima et al. | |
| 6,004,835 A * | 12/1999 | Noble | 438/151 |
| 6,074,928 A | 6/2000 | Ogura | |
| 6,224,668 B1 | 5/2001 | Tamatsuka | |
| 6,245,645 B1 | 6/2001 | Mitani et al. | |
| 6,306,730 B2 | 10/2001 | Mitani et al. | |
| 6,465,319 B1 | 10/2002 | Lee et al. | |
| 6,657,276 B1 * | 12/2003 | Karlsson et al. | 438/424 |

\* cited by examiner

*Primary Examiner*—Chandra Chaudhari
(74) *Attorney, Agent, or Firm*—Yuanmin Cai

(57) ABSTRACT

A region of a semiconductor wafer is converted to an SOI structure by etching a set of isolation trenches for each transistor active area and oxidizing the sidewalls of the trenches to a depth that leaves a pillar of semiconductor that forms a body contact extending from the active area downward to the bulk semiconductor. A self-aligned gate is then formed above the body contact.

18 Claims, 3 Drawing Sheets

SOI DEVICE WITH BODY CONTACT SELF-ALIGNED TO GATE

TECHNICAL FIELD

The field of the invention is that of integrated circuit fabrication, in particular CMOS circuits on a SOI wafer.

BACKGROUND OF THE INVENTION

In the field of fabricating integrated circuits on insulating substrates, such as SIMOX, bonded wafers and the like, there has been a constant problem of forming a body contact.

As is well known, MOS transistors need a body contact to avoid charge buildup within the body.

Many schemes have been devised to form a body contact during the process of transistor formation. These schemes take away area from the active area of the transistor.

Other schemes have been devised to form body contacts at an early stage—e.g. before the bonding of the two wafers. Such schemes not only have an obvious problem with alignment, they commit the wafer to a particular circuit layout that places the transistors in a fixed position.

SUMMARY OF THE INVENTION

The invention relates to a method of forming an SOI circuit in which a body contact is formed for each transistor as part of the isolation step that isolates transistors and the gate is formed above the body contact.

A feature of the invention is that the body contact and the gate are self-aligned to the source/drain.

Another feature of the invention is extending the trench isolation step with an additional trench etch that is oxidized transversely to leave only a pillar of un-oxidized silicon that forms the body contact. A self-aligned gate is then formed above the body contact.

Another feature of the invention is the capability to have both SOI devices and bulk devices in the same circuit by forming the SOI region in a limited area of the circuit, leaving the remainder with bulk silicon.

DETAILED DESCRIPTION

Figure 1:
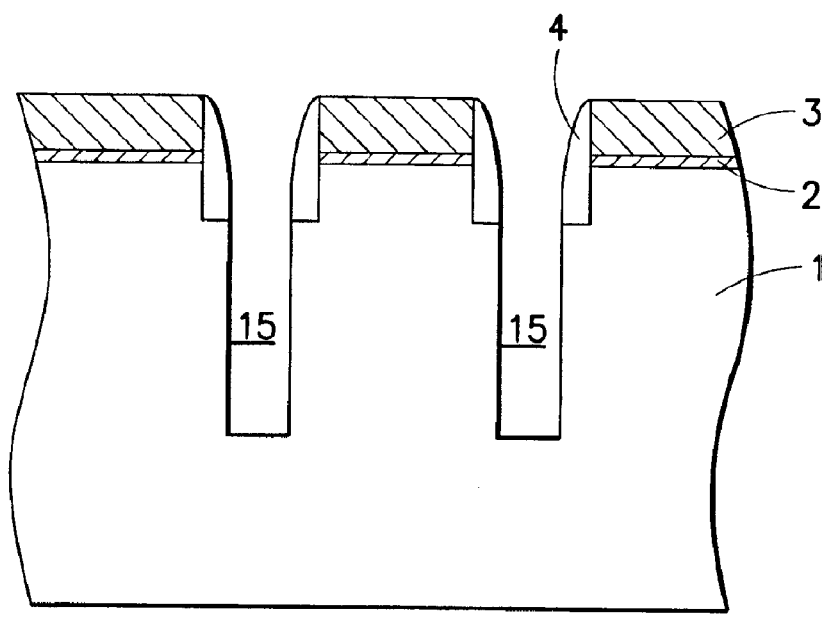
FIG. 1 shows a cross section of a portion of a circuit after the second trench etch.

FIG. 1 shows the result of preliminary steps in silicon wafer 1, having pad oxide 2 and pad nitride 3. A first etch has been made into the silicon to the depth of sidewalls 4. The nitride sidewalls 4 have been put down in conventional fashion to a reference thickness. The nitride on the horizontal surfaces has been etched away, leaving the sidewalls as shown, which protect the area between the trenches in subsequent steps. The nitride can be formed by deposition and/or thermal nitridation.

A second etch has extended the trench downward to a depth that will be the bottom of the buried oxide layer (BO).

Figure 2:
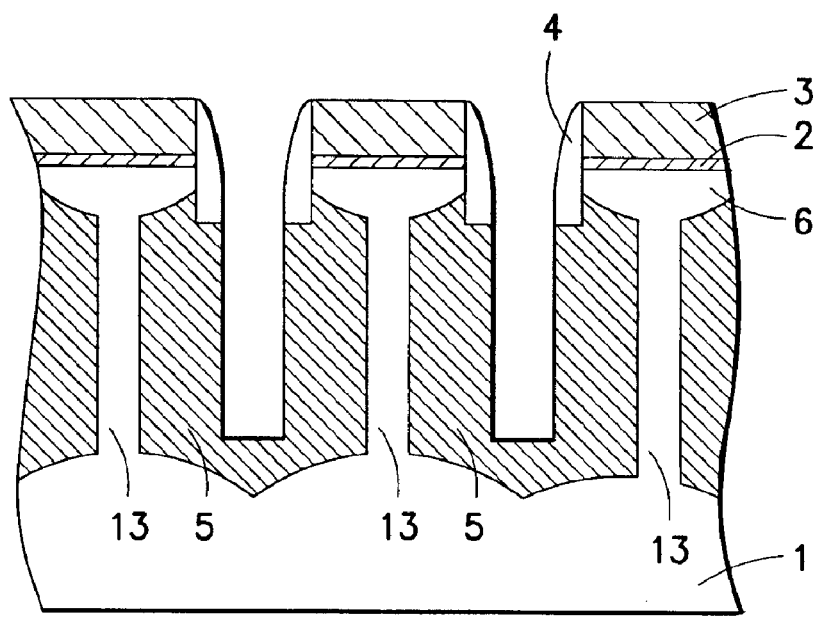
FIG. 2 shows the same portion of the circuit after transverse oxidation that leaves a self-aligned body contact extending downward from the transistor body to the bulk silicon.

FIG. 2 shows the result of a transverse oxidation starting with the exposed silicon in trench 15 and extending as shown converting oxide 5 on the left and right (and also in front of and behind the plane of the cross section) to leave a defined silicon pillar 13 which is protected by the sidewalls 4 from being oxidized. The oxidation may take place in an atmosphere containing at least one of O2, N2O, NO, H2O, H2, and D2. The oxidation temperature may be from 700° C. to 1200° C. preferably from 900° C. to 1100° C., and more preferably from 950° C. to 1000° C. The oxidation can be performed by a furnace process or a rapid thermal oxidation (RTO) process. Pillar 13 forms the self-aligned body contact between area 6, which will become the transistor body, and the bulk silicon 1 . Depending on the dimensions of the transistor formed later, the size of the pillar varies and can be pre-set by the oxidation conditions. For the current technology, the pillar is preferably between 10 nm to 50 nm, and more preferable between 20 to 30 nm.

Figure 3:
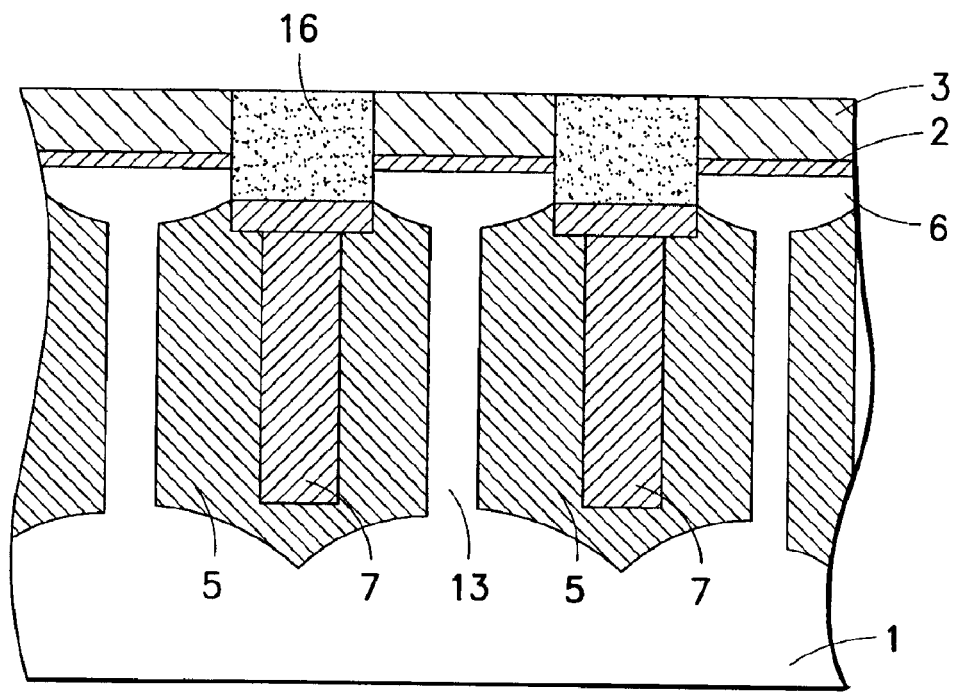
FIG. 3 shows the area after recessing the field area between transistors and filling it with polysilicon (poly).

Next, the nitride spacer 14 is optionally stripped and the isolation trenches 15 are filled with insulator 7, such as TEOS or spin-on glass. A liner, such as nitride, may be formed on the sidewall of the trench 15 before it is filled. FIG. 3 shows the result of recessing the upper portion of oxide 7 and filling the space with polysilicon (poly) or silicon germanium 16.

Figure 4:
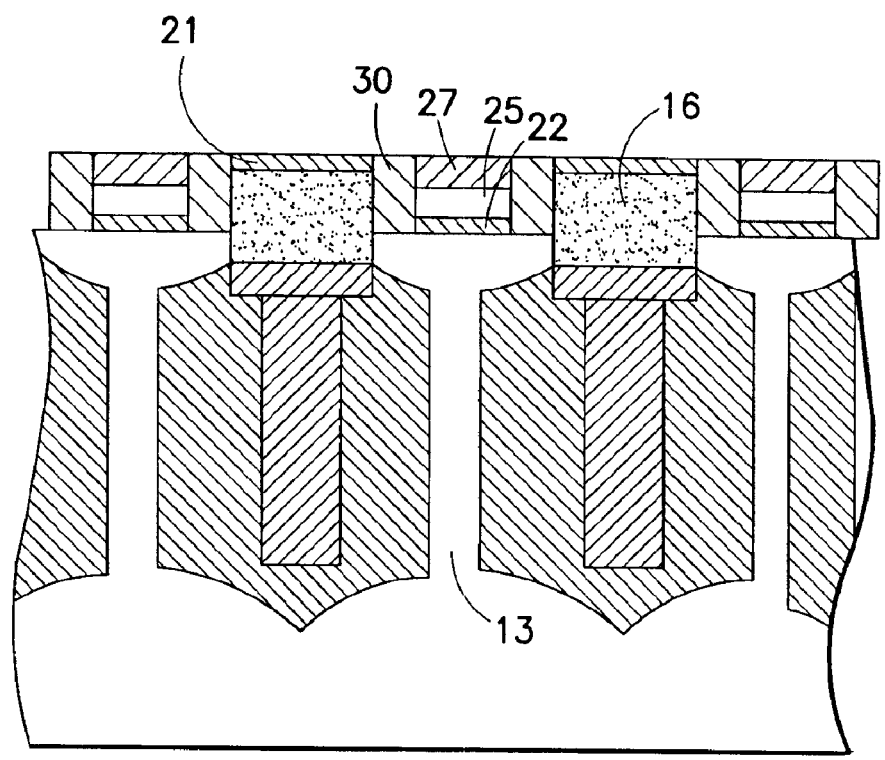
FIG. 4 shows the area after forming a self-aligned transistor gate stack in the active area.

FIG. 4 shows the result of removing the pad oxide and pad nitride in the active area above pillar 13 and forming sacrificial nitride spacers 30 having a thickness that will cover the source and drain of the transistor to be formed.

A gate stack comprising a gate insulator 22, a gate electrode 25 and a nitride cap 27 is then formed in the aperture between the nitride spacers 30. An advantageous feature of this invention is that the gate is thereby self-aligned to the body contact. This is very critical for the CMOS technology as the transistor size is becoming smaller and smaller and alignment is becoming more and more difficult.

The gate insulator includes, but is not limited to, oxide, nitride, oxynitride, high-k dielectric material(s), or any suitable combination of these materials. The gate electrode includes, but is not limited to, polysilicon, germanium, silicon germanium, metal(s), silicide(s), metallic nitride, or any suitable combination of these materials. Illustratively, the gate stack comprises a thermal oxide with polysilicon above it. A cap layer 27, e.g., a nitride layer, is put down over the gate poly to protect the gate stack during the steps that clear the area around the gate stack. An oxide layer 21 has been formed on the exposed poly 16 at the same time if the transistor gate dielectric 22 is formed by thermal oxidation. The excess poly 25 and nitride 27 have been planarized at any convenient time in a conventional step such as CMP.

Figure 5:
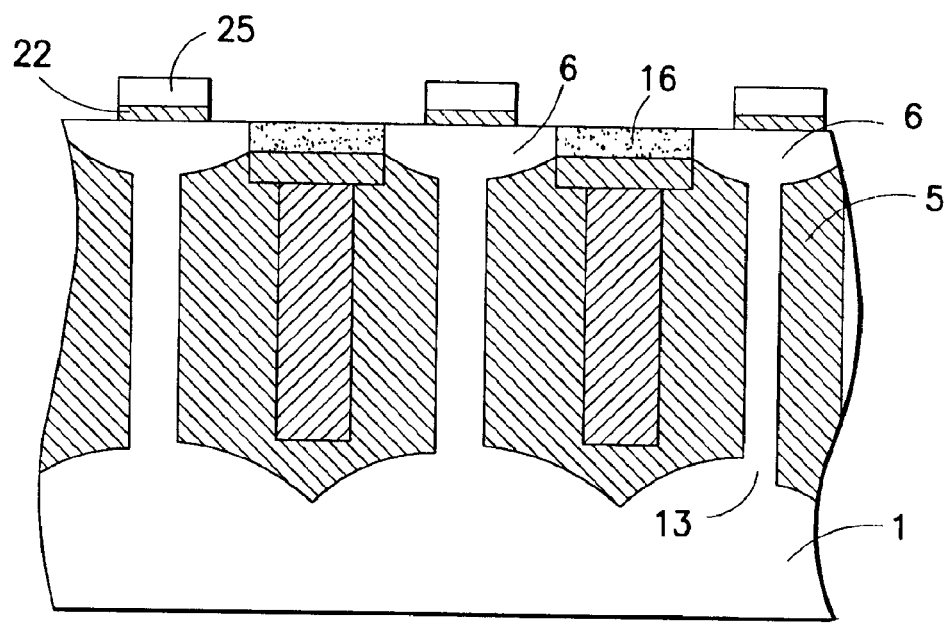
FIG. 5 shows the area after removing the sacrificial nitride spacer and the nitride cap over the gate stack.

Next, the oxide 21 above the poly 16 is removed and the poly 16 is recessed. The nitride cap 27 and sacrificial nitride sidewalls 30 protect the gate stack in these processes. This step leaves a relatively large field area between transistors, which may be used for forming local interconnect. FIG. 5 shows the result of removing the nitride cap 27 and the sidewalls 30 after poly recess.

Figure 6:
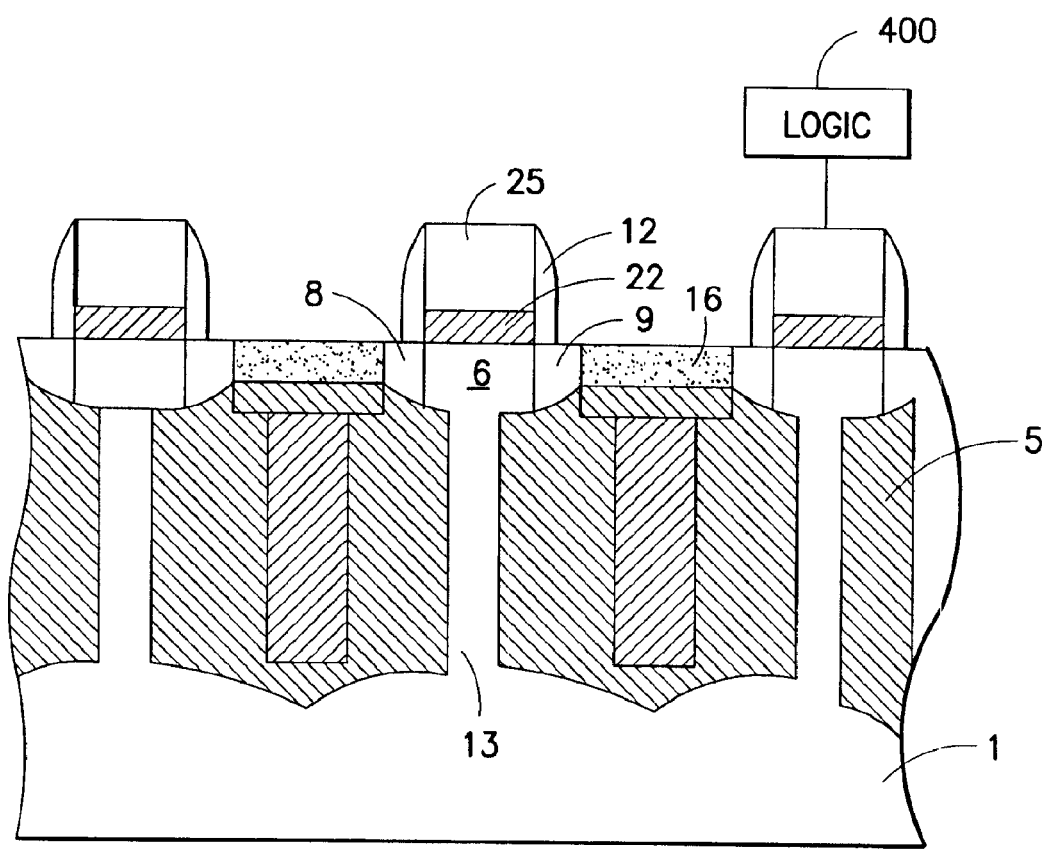
FIG. 6 shows the area after the implantation steps of halo and extension implants, formation of sidewall spacer, and formation of source and drain.

FIG. 6 shows the result of performing halo and extension implants and then forming nitride spacers 12 adjacent to the edge of gate electrode 25. Source and drains 8 and 9 have been formed in a conventional CMOS process. Transistor body 6 remains unchanged by these steps, thereby preserving the self-alignment with the body contact pillar 13.

Those skilled in the art will appreciate that the implantation of the S/D may be performed with an implant mask that: a) permits selected adjacent transistors to be connected by having the implant extend to connect two neighboring electrodes (source and/or drain); or b) block the implant where the circuit requires electrical separation of adjacent transistors. Optionally, the implant mask may extend the S/D region into the poly (so that part of the S/D region is poly), thus permitting a larger tolerance in aligning the contacts to the transistors.

Interconnects and other back end work will be performed in a step referred to as completing the circuit. Box 400 represents schematically the other components of the integrated circuit, including bulk devices in a separate location that does not receive the SOI structure.

Summarizing: Pad oxide and nitride deposition on a bulk Si substrate;
Patterning and opening the pad layers for the first trench;
First trench RIE into bulk silicon with the first depth (about the device depth to the top of the BO);
Nitride spacer formation on the first trench walls;
Second trench to the bottom of the BO (RIE, wet or plasma etch);
Oxidation of the trench walls to a transverse dimension that leaves the body contact;
Trench spacer removal (optional);
Fill trenches with oxide;
Recess trenches, fill with sacrificial poly;
Strip pad nitride, oxide over active area, form nitride spacers over S/D, grow gate oxide (oxide layer forms on sacrificial poly), deposit gate poly, nitride cap;
Strip field oxide, recess field poly;
Strip nitride cap, spacers in active area;
Implant halo, extension, form standard nitride spacers;
Implant S/D;
Form back end.

While the invention has been described in terms of a single preferred embodiment, those skilled in the art will recognize that the invention can be practiced in various versions within the spirit and scope of the following claims.

What is claimed is:

1. A method of forming at least one CMOS transistor in a semiconductor wafer comprising the steps of:
providing a bulk semiconductor wafer with at least one pad layer;
patterning and etching an SOI region of said wafer in a first etch step with a set of trenches adapted to isolate a set of individual transistors in individual active areas;
extending said set of trenches vertically in a second etch step;
oxidizing said wafer transversely through sides of said set of trenches to a transverse dimension such that a layer of buried oxide is formed, containing a pillar of un-reacted semiconductor material in said individual active areas connecting vertically a set of transistor body areas with said bulk semiconductor wafer;
forming a set of MOS transistors in said individual active areas such that the gate of said set of MOS transistors are self-aligned to said pillar.

2. A method according to claim 1, further comprising a step of forming at least one CMOS transistor in a non-SOI region outside said SOI region.

3. A method according to claim 1, in which said first etch step extends downwardly to the bottom of a set of transistor bodies.

4. A method according to claim 1, further comprising a step after said first etch step and before said second etch step of forming liners in said set of trenches.

5. A method according to claim 4, said liners are nitride and formed by one of deposition or thermal nitridation, or combination of both.

6. A method according to claim 1, further comprising a step of filling said trenches with oxide after said step of oxidizing said wafer transversely.

7. A method according to claim 6, further comprising a step of recessing said oxide in the upper portion of said trenches to form an aperture and filling said aperture with a sacrificial material.

8. A method according to claim 7, further comprising steps of stripping said pad layer above said transistor active areas selective to said sacrificial material, thereby forming a set of active area apertures aligned with said pillars of unreacted semiconductor material;
forming sidewall pillars within said active area apertures; then
sequentially forming a gate dielectric, gate electrode and a cap layer self-aligned to said active area apertures.

9. A method according to claim 8, further comprising the steps of stripping said sidewall pillars and forming a source and drain.

10. A method according to claim 1, in which said step of oxidizing said wafer transversely is performed in a furnace process at 1000° C. or more for at least 60 minutes.

11. A method of forming an integrated circuit in a semiconductor wafer comprising the steps of:
providing a bulk semiconductor wafer with at least one pad layer;
patterning and etching an SOI region of said wafer, separate from a bulk region of said wafer, in a first etch step with a set of trenches adapted to isolate a set of individual transistors in individual active areas;
extending said set of trenches vertically in a second etch step;
oxidizing said wafer transversely through sides of said set of trenches to a transverse dimension such that a layer of buried oxide is formed, containing a set of pillars of un-reacted semiconductor material self-aligned to said individual active areas and connecting vertically a set of transistor body areas in said individual active areas with said bulk semiconductor wafer;
forming a set of MOS transistors in said individual active areas; and
connecting said set of MOS transistors to form said circuit.

12. A method according to claim 11, further including a step of forming MOS transistors in said individual active areas with a gate self-aligned to the pillar of unreacted semiconductor material, whereby the pillar forms a body contact to said MOS transistor.

13. A method according to claim 12, further comprising a step of filling said trenches with oxide after said step of oxidizing said wafer transversely.

14. A method according to claim 13, further comprising a step of recessing said oxide in the upper portion of said trenches to form an aperture and filling said aperture with a sacrificial material.

15. A method according to claim 14, further comprising steps of stripping said pad layer above said transistor active areas selective to said sacrificial material, thereby forming a set of active area apertures aligned with said pillars of unreacted semiconductor material;

forming sidewall pillars within said active area apertures; then sequentially forming a gate dielectric, gate electrode and a cap layer self-aligned to said active area apertures.

16. A method according to claim 15, further comprising the steps of stripping said sidewall pillars and forming a source and drain.

17. A method according to claim 16, in which said sacrificial material is poly and said step of forming a source and drain extends transversely such that at least part of the source/drain region is filled by poly.

18. A method according to claim 12, in which the pillar width is from 10 nm to 50 nm.

* * * * *